(12) United States Patent
Mikhaylichenko et al.

(10) Patent No.: US 7,806,126 B1
(45) Date of Patent: Oct. 5, 2010

(54) SUBSTRATE PROXIMITY DRYING USING IN-SITU LOCAL HEATING OF SUBSTRATE AND SUBSTRATE CARRIER POINT OF CONTACT, AND METHODS, APPARATUS, AND SYSTEMS FOR IMPLEMENTING THE SAME

(75) Inventors: Katrina Mikhaylichenko, San Jose, CA (US); Kenneth C. Dodge, Palo Alto, CA (US); Mikhail Korolik, San Jose, CA (US); Michael Ravkin, Sunnyvale, CA (US); John M. de Larios, Palo Alto, CA (US); Fritz C. Redeker, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 1196 days.

(21) Appl. No.: 11/241,045

(22) Filed: Sep. 30, 2005

Related U.S. Application Data

(63) Continuation-in-part of application No. 10/261,839, filed on Sep. 30, 2002, now Pat. No. 7,234,477.

(51) Int. Cl.
*B08B 3/00* (2006.01)
*F26B 3/353* (2006.01)

(52) U.S. Cl. ............... 134/95.1; 134/95.2; 134/105; 134/902

(58) Field of Classification Search ............ 134/95.2, 134/902, 95.1, 105
See application file for complete search history.

(56) References Cited

U.S. PATENT DOCUMENTS

| | | | |
|---|---|---|---|
| 5,986,874 A * | 11/1999 | Ross et al. | 361/234 |
| 2005/0139318 A1 * | 6/2005 | Woods et al. | 156/345.21 |
| 2006/0254716 A1 * | 11/2006 | Mosden et al. | 156/345.43 |

* cited by examiner

*Primary Examiner*—Joseph L Perrin
*Assistant Examiner*—Benjamin Osterhout
(74) *Attorney, Agent, or Firm*—Martine Penilla & Gencarella LLP

(57) ABSTRACT

A substrate support for holding a substrate during fluid preparation is provided. The substrate support includes a support member defined from a resistive material. The support member is coupled to a first electrode and a second electrode to enable current heating of the resistive material of the support member. The support member is configured to support the substrate at a point. The current heating assists in evaporating fluid at the point during fluid preparation of the substrate.

19 Claims, 11 Drawing Sheets

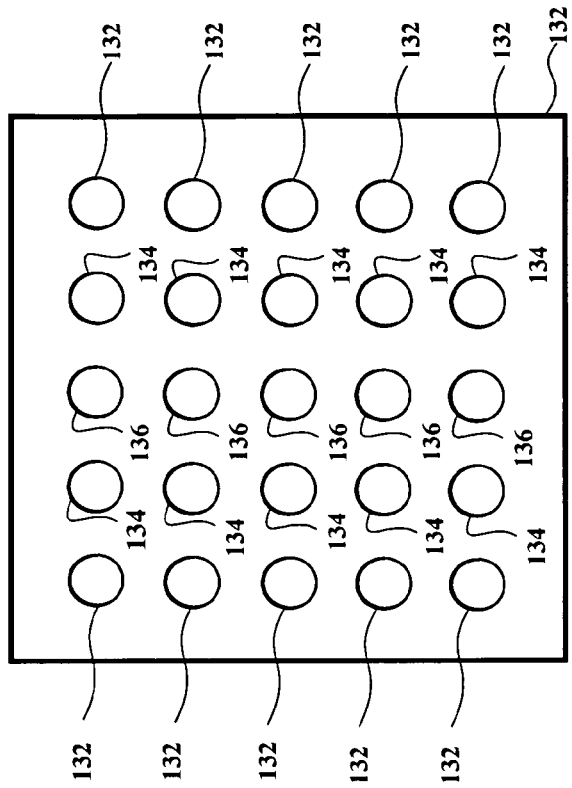
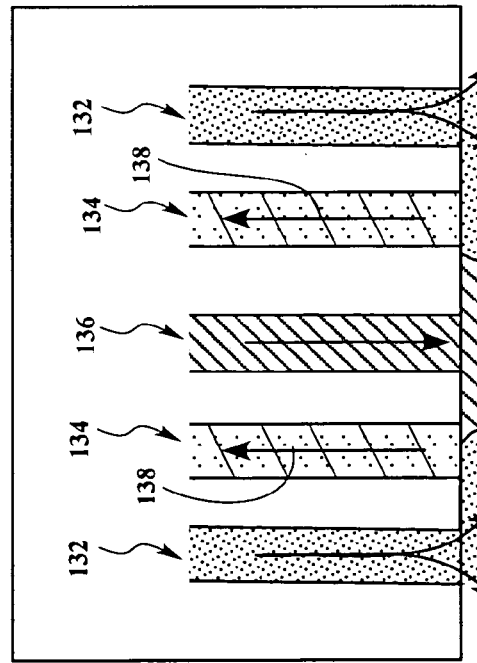
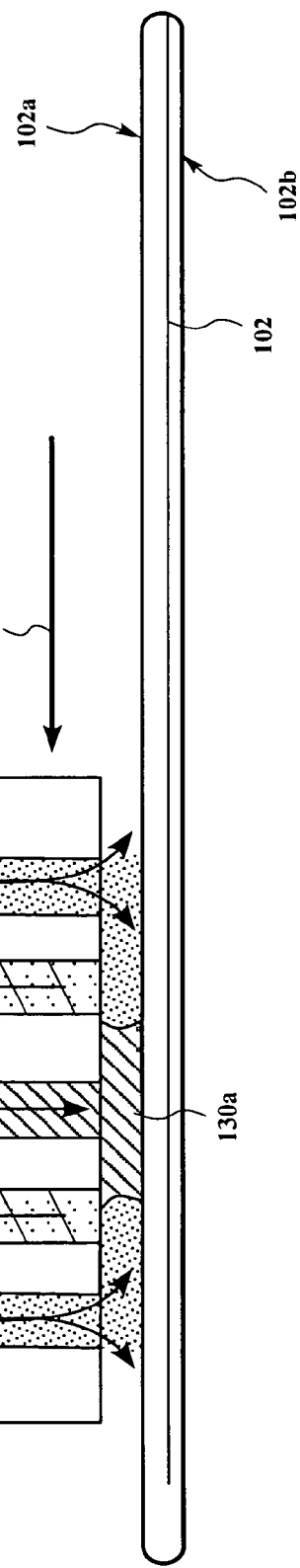
FIG. 5A
FIG. 5B

SUBSTRATE PROXIMITY DRYING USING IN-SITU LOCAL HEATING OF SUBSTRATE AND SUBSTRATE CARRIER POINT OF CONTACT, AND METHODS, APPARATUS, AND SYSTEMS FOR IMPLEMENTING THE SAME

CROSS-REFERENCE TO RELATED APPLICATIONS

This application is a continuation-in-part of U.S. patent application Ser. No. 10/261,839, filed on Sep. 30, 2002, now U.S. Pat. No. 7,234,477 and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES," from which priority under 35 U.S.C. §120 is claimed. The disclosure of this application is incorporated herein by reference in its entirety.

BACKGROUND

The present invention relates generally to substrate cleaning and/or drying and, more particularly, to systems, apparatus, and methods for improving semiconductor substrate surfaces cleaning and/or drying.

DESCRIPTION OF THE RELATED ART

The fabrication of semiconductor devices involves numerous processing operations. These operations include, for example, dopant implants, gate oxide generation, inter-metal oxide depositions, metallization depositions, photolithography patterning, etching operations, chemical mechanical polishing (CMP), etc. As these operations generate particles and residues, substrate surfaces should be cleaned so as to remove particulate contaminants adhered to the surfaces of the substrate.

Particulate contaminants generally consist of tiny bits of distinctly defined material having an affinity to adhere to the surfaces of the substrate. Examples of particulate contaminants can include organic and inorganic residues, such as silicon dust, silica, slurry residue, polymeric residue, metal flakes, atmospheric dust, plastic particles, and silicate particles, among others. Failure to remove the particulate contaminants from substrate surfaces can have detrimental effects on the performance of integrated circuit devices.

The cleaning of the substrate front sides (i.e., the active side or top surface) has traditionally been given a higher priority in typical substrate cleaning systems and processes because deleterious defects may be caused in the processing of the substrates. However, as substrate sizes have increased and/or feature sizes have decreased, certain shortcomings have been associated with the failure to adequately and properly clean and process substrate backsides (i.e., non-active side).

One drawback associated with having contaminant particulates on substrate backsides is the migration of particulate contaminants from the substrate backside to the substrate front side. For example, the migration may occur during a wet processing step and/or as the substrate is being moved or otherwise handled between the processing or metrology tools. Furthermore, the backside contaminants can undesirably migrate from the tools or steps of one process to tools and steps of the following processes, thus contaminating the subsequent processes.

To eliminate such drawbacks, backside of substrates can be cleaned, rinsed, and dried in a substrate preparation assembly wherein the substrate is engaged securely by substrate holders during operation. However, engaging the substrate by substrate holders can have certain negative consequences. For instance, fluid (e.g., cleaning, drying, etc.) can be introduced between the points of contact between the substrate holders and front and backsides of the substrate. Unfortunately, the fluid may not be eliminated completely by the conclusion of the drying operation due to the presence of surface tension between the fluid and the substrate holders.

Additionally, any residual fluid on the substrate backside can migrate to the substrate front side, thus re-contaminating the otherwise cleaned substrate front side. Furthermore, the residual fluid maybe introduced to the otherwise cleaned and dried substrates in the output cassette. Thus, the migration of residual fluid can compromise the quality of the substrate preparation operations, and as such, is disfavored.

In view of the foregoing, there is a need for a system, apparatus, and method capable of improving the reliability of the substrate preparation operations.

SUMMARY

Broadly speaking, the present invention fills these needs by providing a method, apparatus, and system for improving the reliability of substrate backside preparation operations. In one example, the present invention is configured to eliminate any residual fluid defined at a point of contact between a substrate backside and a substrate support member secured to a substrate carrier. According to one implementation, the residual fluid is evaporated by in-situ resistive heating of the point of contact between the substrate backside and the substrate support member. In one example, the substrate support member is a pin.

It should be appreciated that the present invention can be implemented in numerous ways, including as a process, an apparatus, a system, a device, or a method. Several inventive embodiments of the present invention are described below.

In one embodiment, a substrate support for holding a substrate during fluid preparation is provided. The substrate support includes a support member defined from a resistive material. The support member is coupled to a first electrode and a second electrode to enable current heating of the resistive material of the support member. The support member is configured to support the substrate at a point. The current heating assists in evaporating fluid at the point during fluid preparation of the substrate.

In another embodiment, a method for removing a residual fluid remaining at a point of contact between a substrate support member and a back surface of a substrate being prepared by a proximity head is provided. The method includes applying the proximity head onto the back surface of the substrate and the substrate support member being held by a carrier. The substrate support member is heated once the substrate support member passes by the proximity head. The heating of the substrate support member is discontinued once the residual fluid has substantially evaporated.

In still another embodiment, a substrate preparation system is provided. The system includes a carrier, a proximity head, a substrate support member, and a pair of electrical contacts. The carrier is configured to hold a substrate to be prepared. The substrate has a front surface and a back surface. The proximity head is defined proximate to the back surface of the substrate and is configured to prepare the back surface of the substrate. The substrate support member has a first and a second end and is secured to the carrier. The first end of the substrate support member is in contact with the back surface of the substrate at a point of contact. The second end of the support member is secured to the carrier. The substrate support member is configured to be resistively heated after the substrate support member has passed by the proximity head so as to evaporate a residual fluid defined at the point of contact between the first end of the substrate support member and the back surface of the substrate.

In yet another embodiment, a substrate preparation system is provided. The system includes a carrier, leading, middle, and trailing proximity heads, leading, second, and trailing support members, and leading, second, and trailing pairs of electrical contacts. The carrier is configured to hold a substrate to be prepared. The leading, middle, and trailing proximity heads are configured to prepare a back surface of the substrate as the carrier passes by the leading, middle, and trailing proximity heads, successively. The leading, second, and trailing support members are secured to the carrier. The leading, second, and trailing support members have corresponding first ends and corresponding second ends. The first ends of the leading, second, and trailing support members are in contact with a back surface of the substrate at respective points of contact. The second ends of the leading, second, and trailing support members are secured to the carrier. The leading, second, and trailing support members are configured to successively pass by the leading, middle, and trailing proximity heads. As the second ends corresponding to the leading, second, and trailing support members exit the trailing proximity head, successively, the leading, second, and trailing support members are configured to be resistively heated consecutively until residual fluids defined at the corresponding points of contact between the first ends of the leading, second, and trailing support members and the substrate back surface are evaporated.

The advantages of the present invention are numerous. Most notably, the in-situ local heating of the point of contact between the substrate support member and the substrate backside of the present invention provides substrate backsides wherein the point of contact between the substrate support member and the substrate surface is dry. In this manner, no residual fluid is remained at the point of contact between the substrate support member and the substrate backside that can migrate to the otherwise cleaned and dried substrate front side, or cause cross-contamination of the subsequent processes or tools.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2C-2 is a simplified magnification of a region A' shown in FIG. 2C-1 illustrating the position of the trailing meniscus of the trailing proximity head at the time the heating of the leading support member is commenced, in accordance with still another embodiment of the present invention.

FIG. 5A shows a top view of a portion of a proximity head in accordance with one embodiment of the present invention.

FIG. 5B illustrates an inlets/outlets pattern of a proximity head in accordance with another embodiment of the present invention.

DETAILED DESCRIPTION

An invention capable of improving reliability of substrate surface drying operations is provided. In one example, the present invention is configured to eliminate any residual fluid defined at a point of contact between the substrate surface and a substrate support member secured to a carrier. According to one implementation, the residual fluid is evaporated by resistively heating the substrate support member and thus a local contact area between the substrate support member and the substrate backside. In one example, the substrate support member is a pin.

In one aspect, a plurality of proximity heads can be implemented to process substrate supported by a plurality of support members. According to one example, the resistive heating of a leading support member is postponed until the leading support member has passed by a meniscus of a trailing proximity head. In one example, resistively heating the leading support member is initiated once the leading support member has exited the meniscus associated with the trailing proximity head, and may continue until a trailing support member has also passed through the trailing meniscus. The resistive heating of the trailing support member is initiated once the trailing support member exits the trailing proximity head. The meniscus, as disclosed in U.S. patent application Ser. No. 10/261,839, filed on Sep. 30, 2002, and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES," is incorporated herein by reference in its entirety.

Figure 1A:
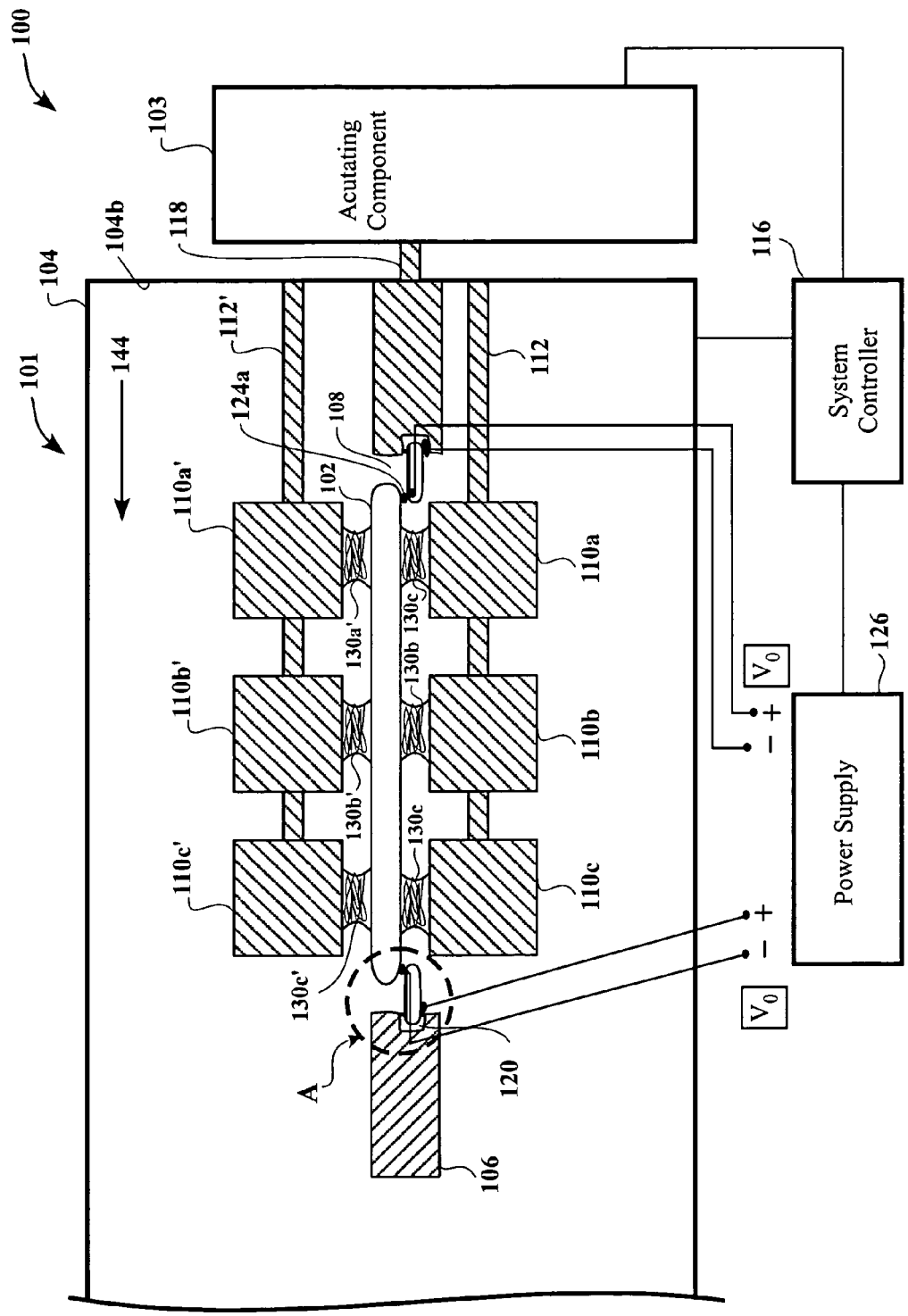
FIG. 1A is a simplified side view of an exemplary proximity preparation system implementing three pairs of parallel bar-type proximity heads, in accordance with one embodiment of the present invention.

FIG. 1A is a simplified side view of an exemplary proximity preparation system 100 implementing three pairs of parallel bar-type proximity heads, in accordance with one embodiment of the present invention. The system 100 includes a chamber 104, an actuating component 114, a system controller 116, and a power supply component 126. Leading, middle, and trailing pairs of front side and backside proximity heads 110$a'$ and 110$a$, 110$b'$ and 110$b$, and 110$c'$ and 110$c$ are defined consecutively and, are secured to an inner sidewall 104$b$ of the chamber 104 by corresponding front and back connection arms 112$'$ and 112. As can be seen, the leading pair of proximity heads 110$a'$ and 110$a$ has the shortest distance to the sidewall 104$b$ while the trailing pair of proximity heads 110$c'$ and 110$c$ has the largest distance from the sidewall 104$b$.

According to one embodiment, the proximity heads 110$a'$-110$c'$ are defined proximate to the front side 102$a$ of the substrate 102 and proximity heads 110$a$-110$c$ are defined proximate to the backside 102$b$ of the substrate 102. Preferably, each pair of proximity heads 110$a'$ and 110$a$, 110$b'$ and 110$b$, and 110$c'$ and 110$c$ is applied onto the front side 102$a$ and backside 102$b$ of the substrate 102, substantially simultaneously. As will be described in more detail with respect to FIGS. 5A-5E, the front and backsides 102$a$ and 102$b$ of the substrate 102 are prepared by the menisci 130$a$-130$c$. In one example, the menisci 130$a$-130$c$ corresponding to the leading, middle, and trailing pair of proximity heads 110$a'$ and 110$a$, 110$b'$ and 110$b$, and 110$c'$ and 110$c$ are moved over the substrate front side and backside 102$a$ and 102$b$ so as to prepare the substrate surfaces. According to one example of the present invention, as used herein, menisci 130$a$-130$c$ are the portions of fluids (e.g., chemistry, pre-rinse fluid, WA vapor, DI water, etc.) defined in regions between the leading, middle, and trailing proximity heads 110$a'$-110$c'$ and 110$a$-110$c$ and the substrate front and back sides 102$a$ and 102$b$, respectively.

As will be described in more detail with respect to FIGS. 2A-5E, each of the leading, middle, and trailing proximity heads 110$a'$-110$c'$ and 110$a$-110$c$ can provide a different function during the preparation of the substrate front and backside 102$a$ and 102$b$. In the illustrated embodiment, the leading pair of proximity heads 110$a'$ and 110$a$ is configured to perform the pre-rinsing operations (e.g., deionized water (DIW) rinsing with drying, DIW rinsing without drying, dispensing of fluid (e.g., DIW, chemistry, etc.) onto the substrate front and backsides, etc.), the middle pair of proximity heads 110$b'$ and 110$b$ is configured to chemically prepare the substrate front and backsides 102$a$ and 102$b$ to perform the treatment operations (e.g., solvent treatment, aqueous chemistry treatment, dispensing of chemistry onto the substrate front and backsides, etc.), and the trailing pair of proximity heads 110$c'$ and 110$c$ is configured to dry the substrate front and backsides 102$a$ and 102$b$ (e.g., rinsing the chemistry applied onto the substrate front and backside in the previous operation, drying the substrate front and backsides, etc.).

One of ordinary in the art must recognize and appreciate that although in the illustrated embodiment three pairs of proximity heads have been implemented, in a different embodiment, any appropriate number of pairs of proximity heads can be implemented (e.g., one, etc.). Furthermore, although in the illustrated embodiment the proximity heads 110$a'$-110$c'$ and proximity heads 110$a$-110$c$ are respectively supported by single connecting arms 112$'$ and 112, in another embodiment, the proximity heads 110$a'$-110$c'$ and proximity heads 110$a$-110$c$ can be supported in any appropriate configuration (e.g., each of the proximity heads 110$a'$-110$c'$ and 110$a$-110$c$ can be connected to the sidewall 104$b$ by a respective connecting arm, each pair of proximity heads 110$a'$ and 110$a$, 110$b'$ and 110$b$, and 110$c'$ and 110$c$ can be connected to the sidewall 104$b$ with a respective connecting arm, etc.).

In the illustrated embodiment, the front and back connection arms 112$'$ and 112, and thus the respective three bar-type proximity heads 110$a'$-110$c'$ and 110$a$-110$c$ are configured to be fixed. However, in a different embodiment, the three bar-type proximity heads 110$a'$-110$c'$ and 110$a$-110$c$ can be configured to move within the chamber 104 so long as the in-situ local heating of the point of contacts between the carrier support members and the substrate backside can be achieved. Additionally, in the subject embodiment, the substrate 102 does not rotate, as the entire front side and backside surfaces 102$a$ and 102$b$ is being traversed and processed by the proximity heads 110$a'$-110$c'$ and 110$a$-110$c$.

In one embodiment, the actuating component 114 can be a motor, however, in a different embodiment, the actuating component 114 can be any component capable of moving the carrier 106 within the chamber 104. Furthermore, one of ordinary skill in the art must appreciate that different mechanics and engineering can be implemented to move the carrier 106 and thus the substrate during operation.

With continued reference to FIG. 1A, the substrate carrier 106 (herein interchangeably referred to as carrier) is coupled to the actuating component 114 via an arm 118. In one example, the carrier 106 is a rectangular flat surface made of a composite material (e.g., carbon fiber, Everslick, Parmax, poly coated carbon fiber, Vespel, SiC, etc.). A circular opening in the carrier 106 forms an inner rim 106$a$ configured to hold the substrate 102 to be prepared. In one example, the substrate 102 is supported by the plurality of support members 108 secured to the inner rim 106$a$ of the carrier 106. In one preferred embodiment the support members are pins. As will be described in more detail with respect to FIGS. 2A-4, insulating components 120 are configured to encapsulate the outer ends of the leading, second, and trailing support members 108$a$-108$c$, thus separating the support members 108$a$-108$c$ from the inner rim 106$c$ of the carrier 106. One of ordinary skill in the art must appreciate that although in the illustrated embodiment the carrier 106 is has a flat rectangular surface, in another embodiment, the carrier 106 may have any shape suitable for holding the substrate 102 to be prepared (e.g., round shape, hexagon shape, appropriate complex shapes, etc.). Furthermore, although in the illustrated embodiment the carrier includes a circular opening, in another embodiment, the opening may have any suitable shape capable of following the shape of the substrate.

In operation, the substrate front and backsides 102$a$ and 102$b$ are prepared as the carrier 106 and thus the substrate 102 are transported horizontally in a movement direction 144 within the chamber 104 and through the proximity heads 110$a'$-110$c'$ and 110$a$-110$c$ and are correspondingly prepared by the menisci 130$a$-130$c$. In one implementation, some of the pre-rinsing, chemicals, or fluids implemented during operation may remain at the points of contact between the exclusionary edge of the substrate backside 102$b$ and the leading, second, and trailing support members 108$a$-108$c$ (e.g., 124$a'$). As will be described in more detail below with respect to FIGS. 2A-4, the residual fluid can be evaporated by resistively heating the leading, second, and trailing support members 108a-108c and the respective local points of contact with the substrate backside 102b. Additional information with respect to the leading, second, and trailing support members 108a-108c is provided below with respect to FIGS. 1B-4.

The system controller 116 is implemented to manage and monitor the actuating component 114 and the power supply 126 during operation. In one example, the system controller 116 can be a computer system. According to one embodiment, the actuating component 114 provides the system controller with feedbacks as to selected parameters. In this manner, the actuating component 114 provides the system controller 116 with feedbacks as to the position of the carrier 106 and thus the substrate 102 with respect to the support members 108. By using the position of the carrier 106 and the substrate 102, the system controller 114 can determine whether any of the support members has exited the trailing meniscus 130c, whether power should be supplied to any of the support members, the amount of voltage to be applied to each support member by the power supply 126, etc.

Figure 1B:
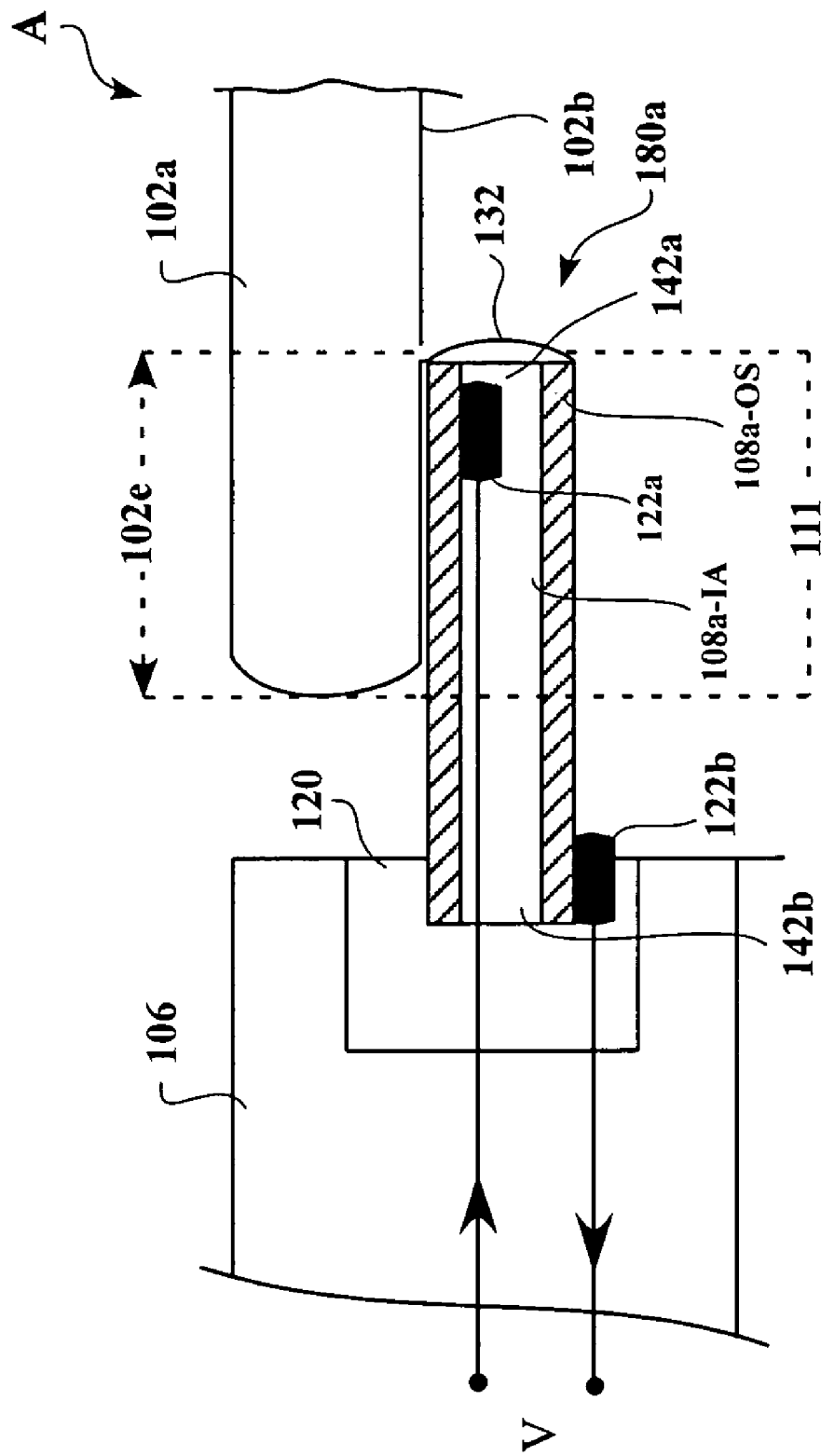
FIG. 1B is a simplified magnification of a region A shown in FIG. 1A, depicting a point of contact between the leading support member and the edge of the substrate backside, in accordance with one embodiment of the present invention.

FIG. 1B is a simplified magnification of a region A shown in FIG. 1A, depicting a point of contact 111 between the leading support member 108a and the exclusionary edge 102e of the substrate backside 102b, in accordance with one embodiment of the present invention. In the illustrated embodiment, the leading support member 108a is a hollow tube, which in one example, is manufactured from SiC. According to one aspect, the substrate 102 is held on the carrier 106 by the weight of the substrate 102 during operation. However, in another example, a latch may be defined on the first end of the leading support member 108a so as to hold the substrate 102 in place during operation and prevent the substrate from moving.

A first end 142a of the leading support member 108a is closed by a sealer component 132, thus preventing any of the process fluids from getting into an inner area 108a-IA of the leading support member 108a. In one example, the sealer component 132 can be silicone, polyurethane, etc.), and can be constructed from (SiC, carbon fiber, etc.). Of course, one of ordinary skill in the art must appreciate that the sealer component can be any component 132 so long as the function of sealing the inner area 108a-AI of the support member 108a can be achieved. Furthermore, the sealer component 132 can be constructed from any suitable material so long as the function of sealing the inner area 108a-AI can be achieved such that the sealing material does not interact with the process fluids.

As can be seen, an electrical contact 122a is defined in the inner area 108a-IA of the leading support member 108a at the first end 142a while an electrical contact 122b is defined on an outer surface 108a-OS of the leading support member 108a proximate to the second end 142b. According to one aspect, establishing electrical contact can be achieved by passing an electrical wire through the tube-type support member 108a. In the illustrated example, voltage is not being applied to the first electrical contact 122a and the second electrical contact 122b.

The second end 142b of the support member 108a is encapsulated by the insulating component 120, therefore electrically isolating the leading support member 108a from the body of the carrier 106. In one example, the insulating material is configured to be ceramic. However, one of ordinary skill in the art should acknowledge and appreciate that the insulating component 120 can be constructed from any suitable material so long as the function of isolating the support member from the carrier body 106 can be achieved (e.g., quartz, polyurethane, etc.). Additional information with respect to the leading, second, and trailing supporting support members 108a-108c will be provided with respect to FIGS. 3 and 4.

As a result, resistance can be built in the leading support member 108a, between the first electrical contact and the second electrical contact 122a and 122b, thus increasing the temperature of the tube. According to one example, electrical current can be transmitted through the SiC support members 108a-108c due to the conductive nature of the carbon in the SiC. Thus, in one instance, the resistivity of the leading, second, and trailing support members 108a-108c can be adjusted by the amount of carbon on the respective first ends 142a and the second ends 122b. For instance, while the leading, second, and trailing support members 108a-108c are being manufactured, mechanical dimensions of the leading, second, and trailing support members 108a-108c as well as the temperature desired for evaporating the residual fluid can be determined. Thus, specific voltages to be implemented can be determined using the dimensions of the support members and the desired temperature of the support member. At this point, the resistance of each of the leading, second, and trailing support members 108a-108c and thus the amount of carbon needed in the SiC members can be determined.

In accordance to one aspect, the content of carbon in the SiC used for manufacturing the support member 108 can differ throughout the support member, thus providing different resistivity levels throughout the support members 108a-108c. For instance, by increasing the amount of carbon in close proximity to the first ends 142a of the leading, second, and trailing support members 108a-108c, high resistivity regions can be formed. Conversely, by lowering the carbon content of the SiC close to the second ends 142b of the leading, second, and trailing support members 108a-108c, lower resistivity can be achieved in close proximity to the carrier 106.

Figure 2A:
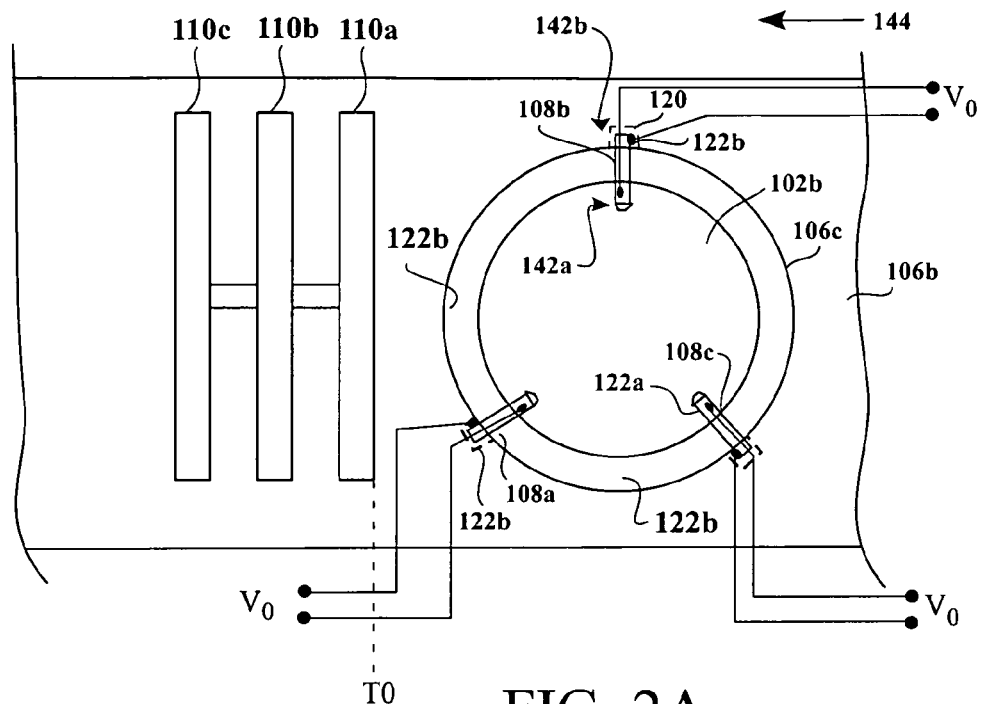
FIG. 2A is a partial bottom view depicting the positions of the leading, second, and trailing support members with respect to the leading, middle, and trailing proximity heads prior to the initiation of proximity processing, in accordance with yet another embodiment of the present invention.

Proceeding to the simplified views of FIGS. 2A-2E, proximity processing of the substrate backside 102b is illustrated, in accordance with one embodiment of the present invention. FIG. 2A is a partial bottom view depicting the positions of the leading, second, and trailing support members 108a-108c with respect to the leading, middle, and trailing proximity heads 110a-110c prior to the initiation of the proximity processing, according to one aspect of the present invention.

In one embodiment, the leading, second, and trailing support members 108a-108c are placed around the inner rim 106c of the carrier 106 at equal distances. According to another embodiment, a gap may exist between the edge of the substrate 102 and the inner rim 106c of the carrier 106. In one example, the size of the gap may range between approximately 0.1 mm and 10 mm. According to one aspect, the gap maybe about one (1) mm.

In the illustrated embodiment, the proximity heads 110a'-110c' and 110-110c are shown to be longer than a diameter of the substrate 102. That is, a length of the leading, middle, and trailing proximity heads 108a'-108c' and 108a-108c is determined such that the length of the respective fluid menisci 130a-130c is substantially the same as a diameter of the substrate. In this manner, the menisci 130a-130c can traverse the entire surface area of the substrate front side and backside 102a and 102b, as the substrate 102 is moved through the leading, middle, and trailing proximity heads.

Each of the leading, second, and trailing support members 108a-108c is shown to have a respective point of contact 111 defined between the leading, second, and trailing support members 108a-108c and the substrate backside 102. Each of the leading, second, and trailing support members 108a-108c is shown to have a respective first end 142a and a second end 142b. The first ends 142a of the leading, second, and trailing support members 108a-108c are the portions of the support members in communication with the substrate backside 102b. Comparatively, the second ends 142b of the leading, second, and trailing support members 108a-108c are secured to the inner rim 106c of the carrier 106. In the illustrated embodiment, the second ends 122b of the leading, second, and trailing support members 108a-108c are respectively separated from the inner rim 106c of the carrier 106 using the insulating components 120. The first electrical contacts 122a have been defined on the inner areas 108a-IA to 108c-IA of the leading, second, and trailing support members 108a-108c in close proximity to the first ends 142a. Similarly, the second electrical contacts 122b have been defined on the outer surfaces 108a-OS to 108c-OS of the leading, second, and trailing support members 108a-108c in close proximity to the second ends 142b.

As can be seen, at a time T0, the leading support member 108a has not yet arrived at the leading backside proximity head 110a. Thus, no voltage is being applied to any of the first or second electrical contacts 122a and 122b of the leading, second, and trailing support members 108a-108c.

Figure 2B:
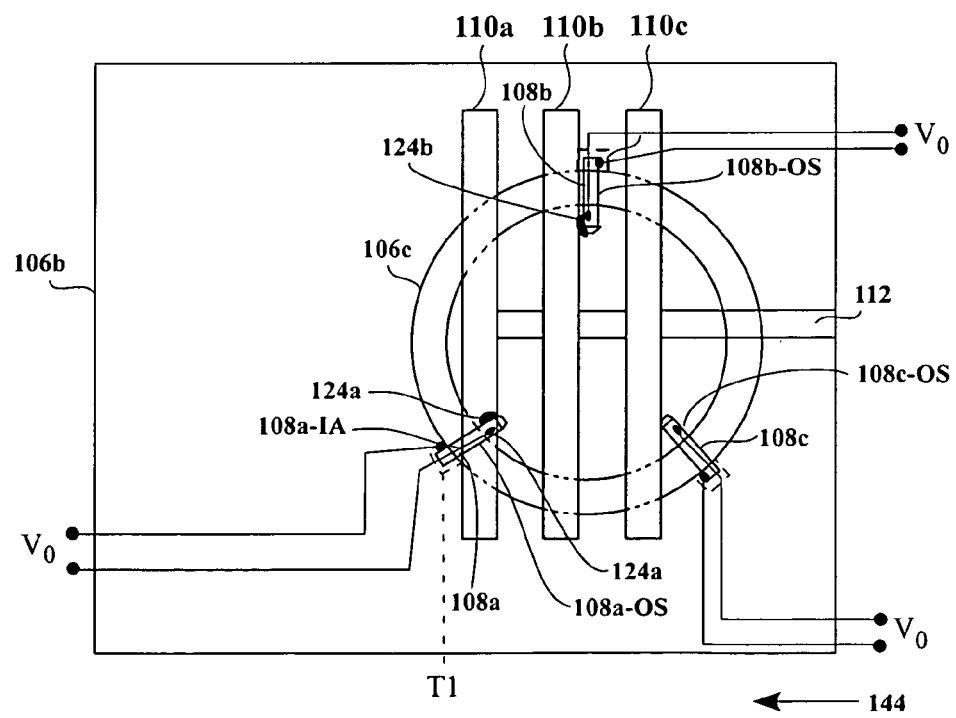
FIG. 2B is a partial simplified bottom view depicting the proximity preparation of the substrate backside at a time T1 of the process, in accordance with still another embodiment of the present invention.

Now referencing the partial simplified bottom view of FIG. 2B, depicting the proximity preparation of the substrate 102 at a time T1 of the process is illustrated, in accordance with one embodiment of the present invention. As can be seen, the leading support member 108a and the second support member 108b have exited the leading proximity head 110a, while the trailing support member 108c has not yet exited the leading proximity head 110a. As a result, at this point, residual fluids 124a and 124b can be depicted around the leading and trailing support members 108a and 108b as well as the respective points of contact 111 with the substrate backside 102b. Comparatively, residual fluid is not depicted around the trailing support member 108c and the respective point of contact 111 with the substrate backside 102b. Furthermore, the leading support member 108a has exited the middle proximity head 110b but still has to exit the trailing proximity head 110c. Therefore, at the time T1, potential is still not being applied to any of the first and second electrical contacts of any of the support members 108a-108c.

Figures 1, 2C:
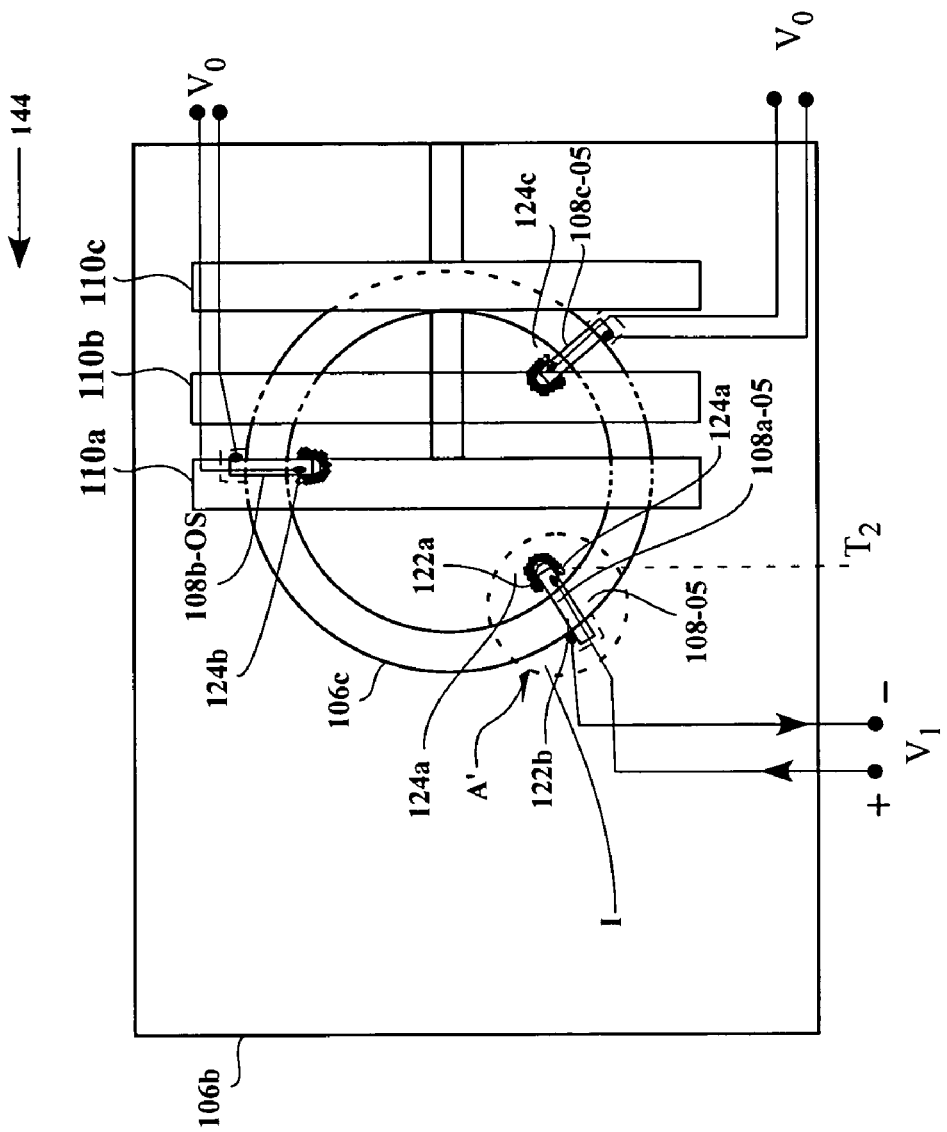
FIG. 2C-1 is a partial simplified bottom view depicting the commencement of heating the leading support member at a time T2, in accordance with still another embodiment of the present invention.

Continuing to the partial simplified bottom view depicted in FIG. 2C-1, commencing the heating of the leading support member 108a at a time T2 is illustrated, in accordance with one embodiment of the present invention. The leading support member 108a has completely passed by (i.e., exited) the leading, middle, and trailing proximity heads 110a-110c. The second support member 108b has passed the leading and middle proximity heads 110a and 110b, however, the second support member 108b still has to pass by the trailing proximity head 110c. The trailing support member 108c almost completely passed by the leading proximity head 110a and still has to pass by the middle and trailing proximity heads 110b and 110c. In one example, a particular support member 108 is considered to have exited a specific pair of proximity heads (or a proximity head of the pair) after the entire length of the particular support member has passed through the menisci corresponding to the specific pair of proximity heads.

Thus, residual fluid 124c can be depicted around the first end 142a of the trailing support member 108c at the point of contact 111 between the trailing support member 108c and the substrate backside 102b. Similar to the trailing support member 108c, residual fluid 124b can be seen around the point of contact 111 between the second support member 108b and the substrate backside 102b as well as around the first end 142a of the second support member 108b. As can be seen, at the time T2, the voltage v1 is being applied to the first and second electrical contacts 122a and 112b of the leading support member 108a so as to resistively heat the leading support member 108a, thus evaporating the residual fluid 124a at the point of contact 111. Comparatively, even though the second support member 108b has exited the leading and middle proximity heads 110a and 110b, the second support member 108b has yet to pass through the trailing proximity head 110c. Hence, the second and trailing support members 108b and 108c are still not being heated at the time T2.

Figures 2, 2C:
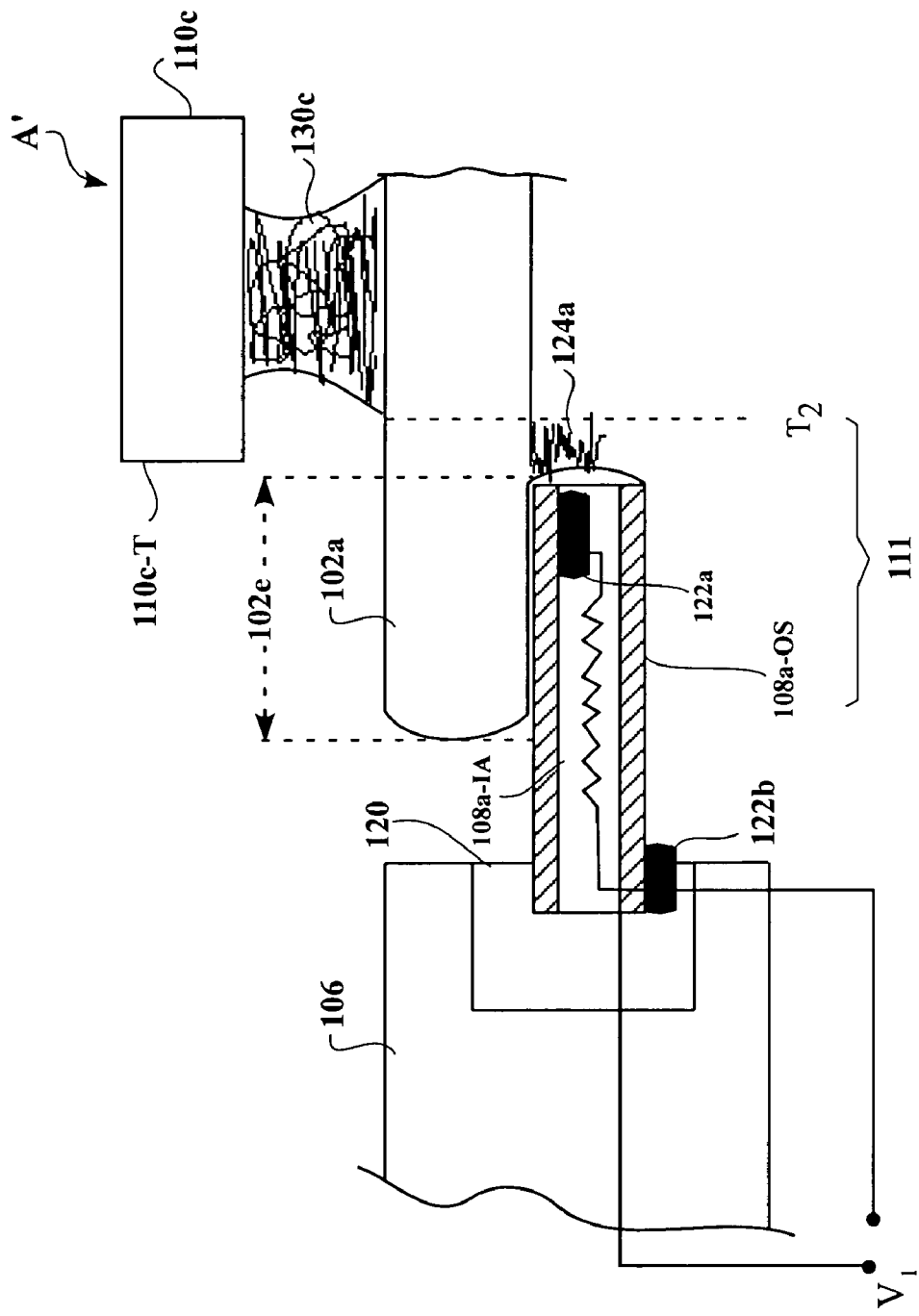

FIG. 2C-2 is a simplified magnification of a region A' shown in FIG. 2C-1, illustrating the position of the trailing meniscus 130c of the trailing proximity head at the time the heating of the leading support member 108a is commenced, in accordance with one embodiment of the present invention. As can be seen, at the time T2, the voltage v1 is being applied to the leading support member 108a, thus increasing the temperature of the support member 108a. The time T2, however, corresponds to the time the first end 142a of the leading support member 108a has completely passed by a trailing end of the trailing meniscus 130c. As can be seen in the illustrated embodiment, the residual fluid 124a can be depicted around the leading support member 108a and between the leading support member 108a and the exclusionary edge of the substrate backside 102b at the point of contact 111. Of course, in another embodiment, the heating of the support members may commence once the first end of the support member 108a has exited a trailing end 110c-T of the trailing proximity head. In the illustrated embodiment, the leading support member 108a is a hollow tube, which in one aspect, is built from SiC.

Figure 2D:
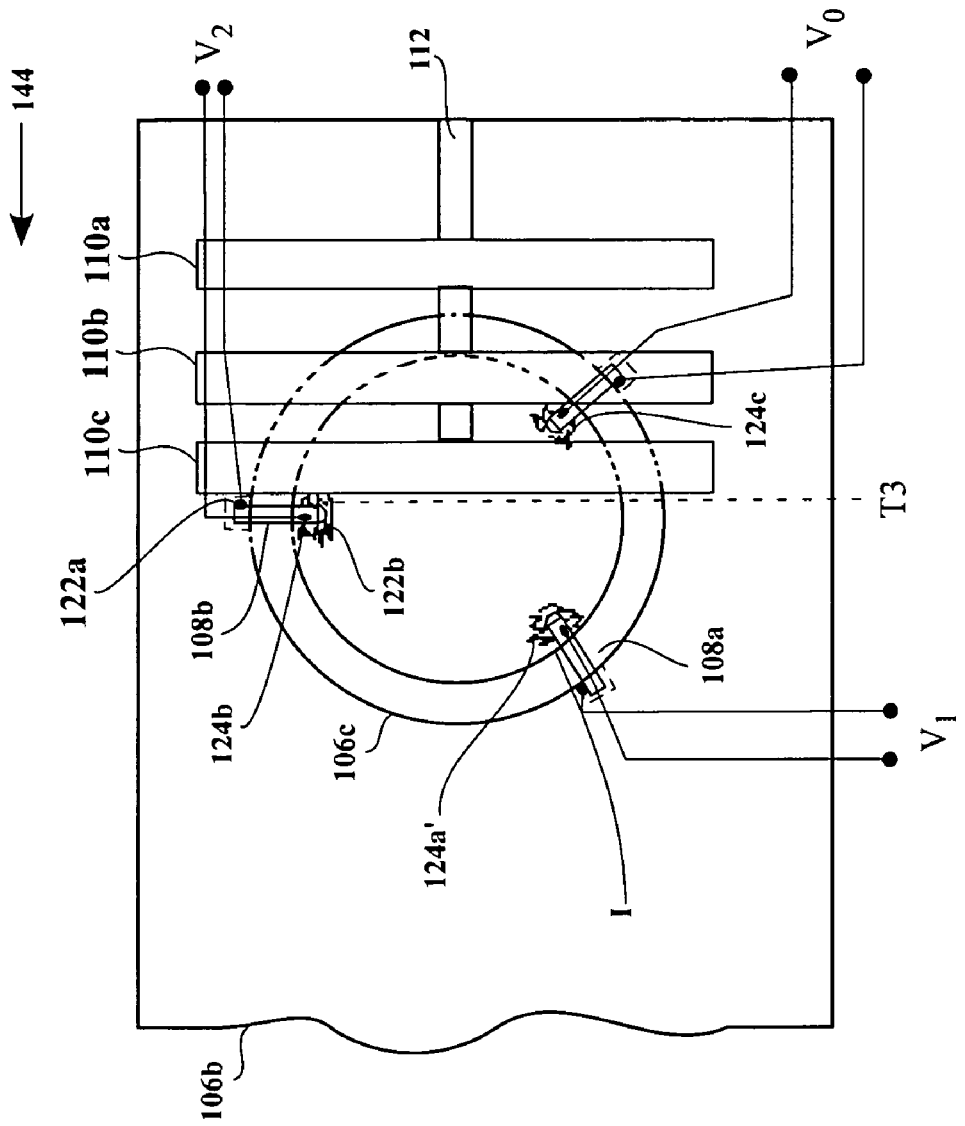
FIG. 2D is a simplified partial view depicting the continued heating of the leading support member and the commencement of heating the second support member at a time T3, in accordance with another embodiment of the present invention.

Continuing to the simplified partial view of FIG. 2D, the continued heating of the leading support member 108a and the commencement of heating of the second support member 108b at a time T3 can be depicted, in accordance with one embodiment of the present invention. The leading, second, and trailing support members 108a-108c have completely exited the leading, second, and trailing support proximity heads 110a-110c. However, the trailing support member 108c has not yet exited the second proximity head 110b and still has to travel through the trailing proximity head 110c. Thus, the residual fluid 124c can be depicted around the point of contact 111 of the trailing support member 108c and the substrate backside 102b. Accordingly, at the time T3, the heating of the second support member 108b is initiated by the application of the voltage v2 to the electrical contacts 122b and 122a of the second support member 108b so as to evaporate the residual fluid 124b. At the time T3, however, the potential v1 is still being applied to the electrical contacts 122a and 122b of the leading support member 108a, as residual fluid 124a' can be depicted at the point of contact point 111. The amount of the residual fluid 124a', however, is less than the amount of the residual fluid 124, indicating the evaporation of at least some of the residual fluid 124a between the time T2 and time T3.

Figure 2E:
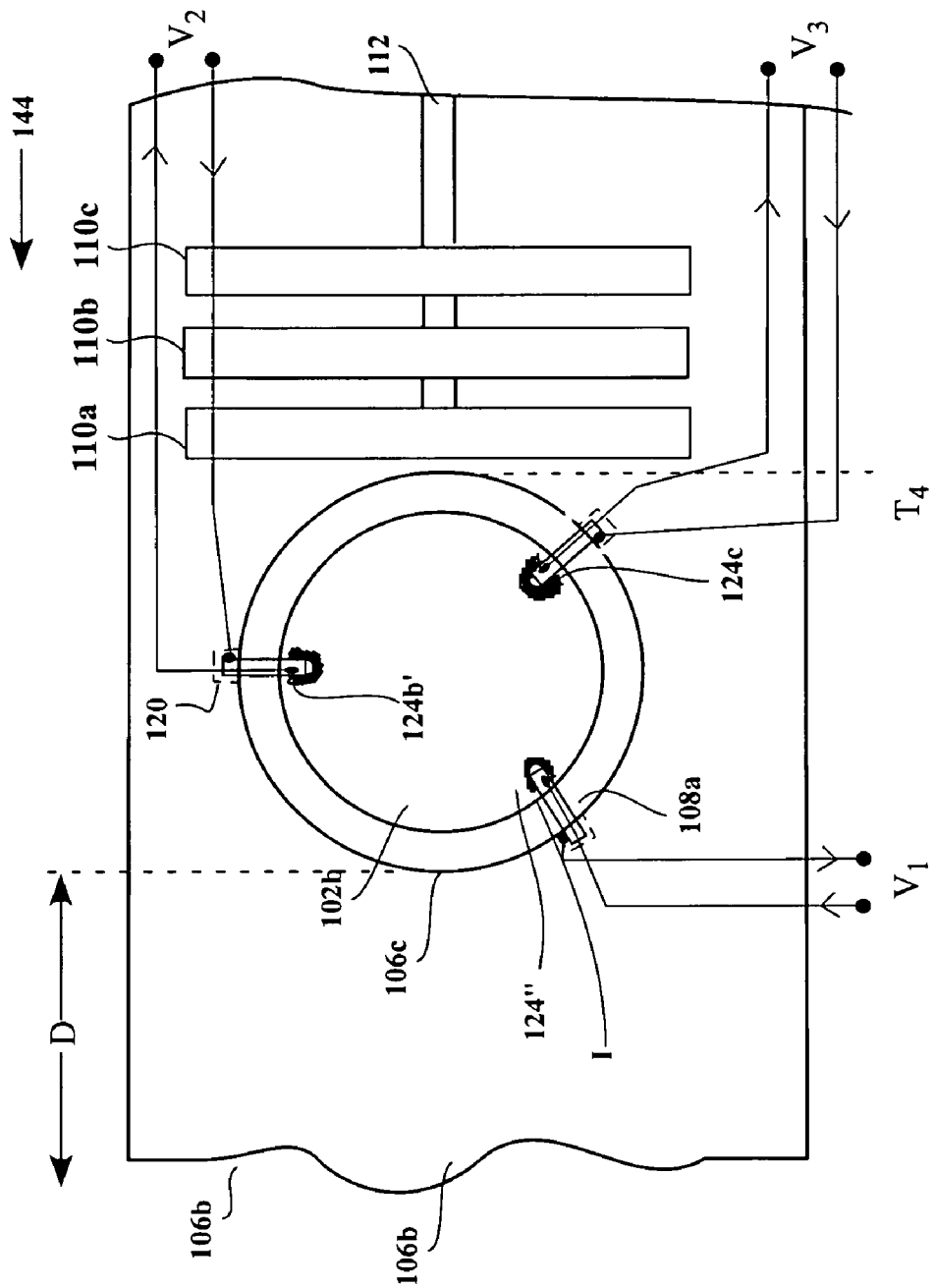
FIG. 2E is a simplified partial view depicting nearly the conclusion of the proximity processing of the substrate, in accordance with still another embodiment of the present invention.

Reference is now made to the simplified partial view of FIG. 2E depicting nearly the conclusion of the proximity processing of the substrate 102, in accordance to one embodiment of the present invention. The leading, second, and trailing support members 108a-108c have completely exited the leading, second, and trailing support proximity heads 110a-110c. As such, potentials v1, v2, and v3 are being applied to the leading, second, and trailing support members 108a-108c, respectively, as shown by the current arrows. As can be seen, the initial residual fluid 124a at the contact point 111 between the leading support member 108a and the substrate backside 102b has almost evaporated, although not completely (i.e., the residual fluid 124c"). As such, potential v1 is still being applied to the leading support member 108a. In the same manner, the potential v2 is being applied to the electrical contacts of the second support member 108b so as to evaporate the residual fluid 124b' at the contact point 111 between the second support member 108b and the substrate backside 102b. Therefore, at least some of the residual fluid 124b has evaporated between T3 and T4. Accordingly, at a time T4, the potential v3 is being applied to the electrical contacts 122a and 122b on the trailing support member 108c so as to evaporate the residual fluid 124c at the point of contact 111 between the trailing support member 108c and the substrate backside 102b.

Given that the heating of the trailing support member 108c was initiated last, at the time T4, the amount of residual fluid 124c around the trailing support member 108c at the point of contact 111 can be greater than the amount of residual fluid 124b' corresponding to the second support member. In turn, the amount of residual fluid 124b' is greater than the amount of residual fluid 124a" around the leading support member 108c. According to one example, the residual fluids 124a", 124b', and 124c are configured to substantially be evaporated by the time the carrier 106 has completed traveling the distance D. In one example, the distance D can be the distance the carrier 106 is configured to travel so as to conclude the proximity processing of the substrate backside 102b. However, in another embodiment, a different criteria maybe implemented to determine the time the heating of the leading, second, and trailing support members 108a-108c should stop. By way of example, the voltages v1-v3 correspondingly applied to the leading, second, and trailing support members 108a-108c can be determined such that the voltage v1 applied to the leading support member is less than the voltage v2 applied to the second support member, which in turn is less than the voltage v3 applied to the trailing support member. In this manner, evaporating the residual fluid around the leading support member 124a and the second support member 124b can be achieved at a lower rate as opposed to the fluid 124c around the trailing support member 108c, due to the trailing support member 108c not having sufficient time before the conclusion of the proximity processing.

In one embodiment, an operating temperature is the temperature of the leading support member 108a when electrical current is being transmitted therein and the residual fluid 124a is still present. While the residual fluid 124a is being evaporated, a drop in the temperature of the leading support member 108a can be sensed. Upon evaporation of all the residual fluid 124a, the temperature of the leading support member 108a starts to increase. In one example, by detecting the increase in the temperature of the support member, the amount of electrical current being supplied to the leading support member 108a maybe lowered or shut down. For instance, the potential may need to be lowered so as to prevent any probable damage at the point of contact 111. Thus, in one example, an infrared thermometer maybe defined within the chamber 104 so as to monitor the temperature of the leading, second, and trailing support members 108a-108c. One must appreciate, however, that in another embodiment, the temperature of the support members 108a-108c may be monitored by any device capable of detecting and monitoring changes in temperature. Accordingly, an increase in the temperature of the support members can be implemented as an indication that the residual fluid has evaporated.

Figure 3:
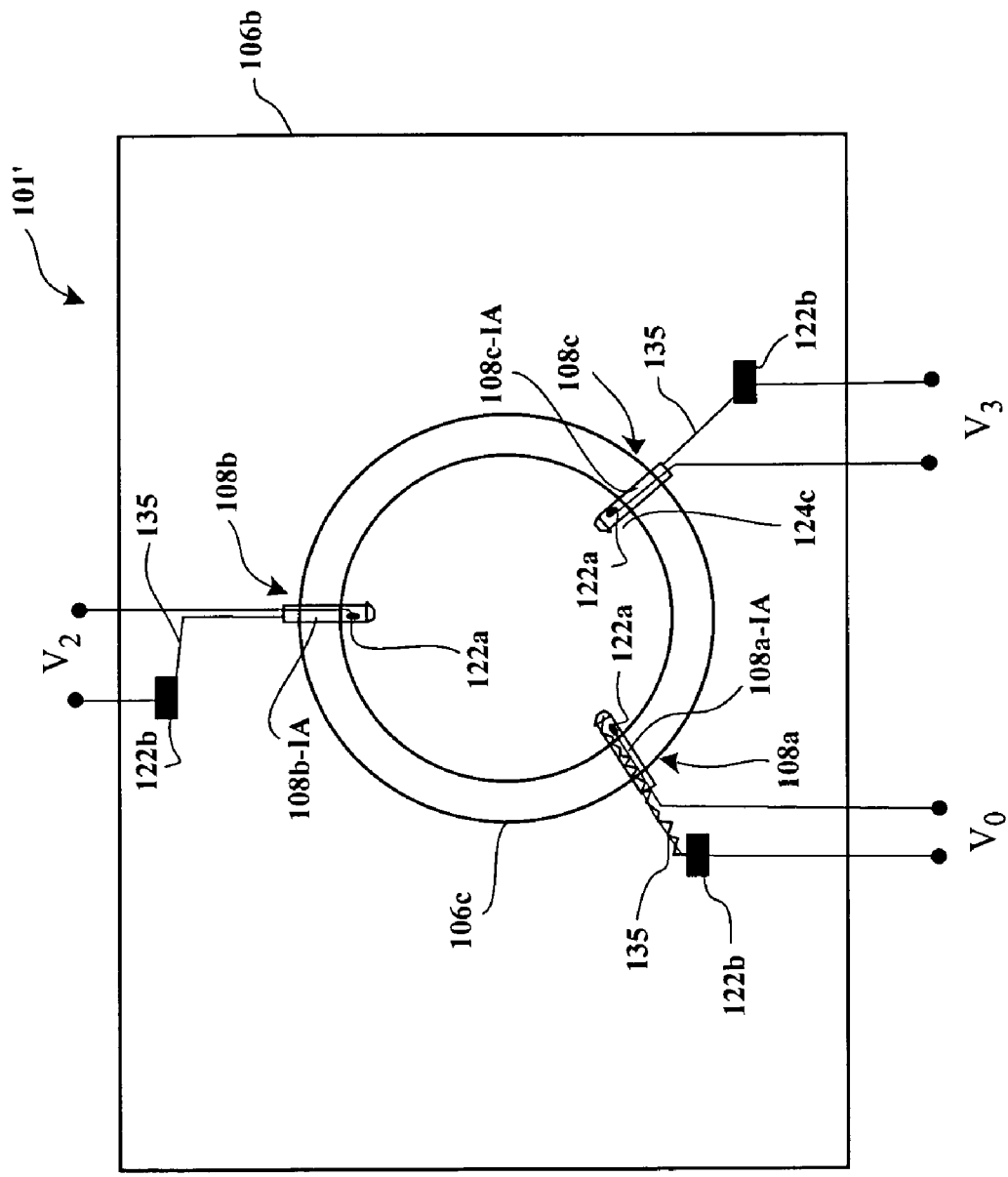
FIG. 3 is a s simplified bottom view illustrating the supporting of the substrate by tube-type leading, second, and trailing support members, in accordance with still another embodiment of the present invention.

Reference is made to the simplified bottom view depicted in FIG. 3 illustrating the substrate 102 being supported by tube-type leading, second, and trailing support members 108a-108c, in accordance with one exemplary embodiment. In the illustrated example, the second electrical contacts 122b are defined on the back side of the carrier 106 while the first electrical contacts 122a are defined on the inner areas 108a-IA through 108C-IA of the leading, second, and trailing support members 108a-108c. As can be seen, however, connectors 135 have been implemented to connect the second electrical contacts 122b defined on the back of the carrier 106 to the respective first electrical contacts 122a. In this manner, the body of the carrier 106 is being implemented to transmit the electrical current between the electrical contacts 122a and 122b so as to resistively heat the leading, second, and trailing support members 108a-108b.

Figure 4:
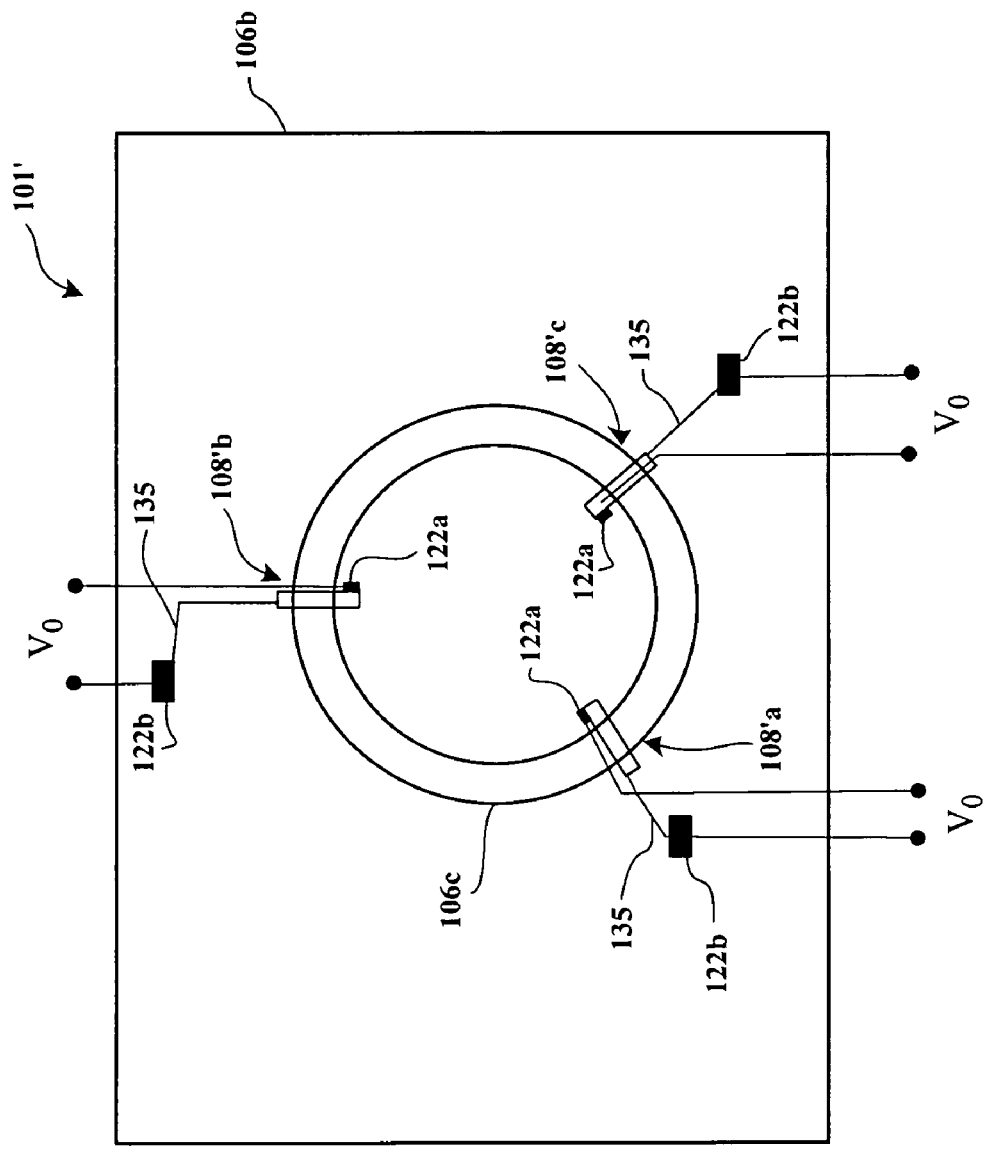
FIG. 4 is a simplified bottom view of the substrate as supported by solid core-type leading, second, and trailing support members, in accordance with still another embodiment of the present invention.

FIG. 4 illustrates a simplified bottom view of the substrate 102 as supported by solid core-type leading, second, and trailing support members 108'a-108'c, in accordance with one exemplary embodiment. In the illustrated example, the second electrical contacts 122b are defined on the backside of the carrier 106 while the first electrical contacts 122a are defined on the outer surfaces 108a-OS through 108C-OS of the leading, second, and trailing support members 108a-108c. Similar to FIG. 3, connectors 135 have been implemented to connect the second electrical contacts 122b defined on the back of the carrier 106 to the respective first electrical contacts 122a. Thus, potentials v1-v3 are applied to the first and second electrical contacts and thus the carrier 106. In this manner, the carrier 106 is implemented to transmit electrical current to the leading, second, and trailing support members 108a'-108c'.

Although in one example, the leading, second, and trailing support members 108a-108c have been illustrated to have a cylindrical hollow tube shape or a solid core shape, in another embodiment, the leading, second, and trailing support members 108a-108c can have any suitable shape so long as the support members can provide adequate mechanical strength for supporting the substrate (e.g., rectangle, triangle, square, etc.). Yet further, although in one example, the support members are constructed from SiC, in a different embodiment, any material capable of transmitting electrical current can be implemented (e.g., tungsten, tantalum, molybdenum, etc.). Still further, although in the illustrated embodiment the substrate is shown to be engaged horizontally, in a different embodiment, the substrate 102 may be engaged in any suitable orientation as long as the orientation enables the proximity processing the substrate surfaces by the proximity heads.

According to one embodiment of the present invention, the proximity substrate preparation module can be incorporated in a clustered substrate processing system. For instance, after a substrate front side and/or backside has been pre-processed in an etching chamber, a chemical vapor deposition system, a chemical mechanical polishing (CMP) system, etc., the substrate front side and back side can be prepared in the system of the present invention. Thereafter, the substrate backside and/or front side can be post-processed in an etching chamber, a chemical vapor deposition (CVD) system, physical vapor deposition (PVD) system, electrochemical deposition (ECD) system, an atomic layer deposition (ALD) system, a lithographic processing system (including coater and stepper) module, etc.

Yet further, in one exemplary implementation, the proximity preparation module of the present invention can be implemented in a clustered substrate cleaning apparatus that may be controlled in an automated way by a control station. For instance, the clustered cleaning apparatus may include a sender station, a proximity preparation module, and a receiver station. Broadly stated, substrates initially placed in the sender station are delivered, one-at-a-time, to the proximity preparation module of the present invention. After being proximity cleaned and dried, dry substrates are then delivered to the receiver station for being stored temporarily. One of ordinary skill in the art must appreciate that in one embodiment, the clustered cleaning apparatus can be implemented to carry out a plurality of different substrate preparation operations (e.g., cleaning, etching, buffing, etc.).

In an exemplary proximity system of the present invention, preparing the substrate surfaces using a meniscus of an exemplary proximity head is described in the following figures. One of ordinary skill in the art must appreciate that any suitable type of system with any suitable type of proximity head that can generate a fluid meniscus can be used with the embodiments of the present invention described herein.

FIG. 5A illustrates an exemplary proximity head 110 performing a substrate processing operation, in accordance with one embodiment of the present invention. The proximity head 110, in one embodiment, stays in place while the carrier and thus the substrate pass through each pair of front and back menisci 130 in close proximity to the front and back menisci so as to conduct the substrate processing operation.

It should be appreciated that depending on the type of fluid applied to the substrate 102, the fluid meniscus 130 generated by the proximity head 110 on the substrate surface 102 may be any suitable substrate processing operation such as, for example, pre-rinsing, cleaning, drying, etc. According to one implementation, the front and back menisci 130a-130c respectively traverse the front and backside the substrate 102 so as to clean and/or dry substrate surfaces by applying pre-rinse fluid, cleaning chemistries, and DI water thus cleaning and drying the substrate surfaces 102a and 102b.

In one embodiment, the proximity head 110 includes source inlets 132 and 136 and a source outlet 134. In such an embodiment, isopropyl alcohol vapor in nitrogen gas IPA/$N_2$ 137 may be applied to the substrate surface through a source inlet 132, vacuum 138 may be applied to the substrate surface through a source outlet 134, and a processing fluid 2153 may be applied to the substrate surface through a source inlet 136.

In another embodiment, the application of the IPA/$N_2$ 137 and the processing fluid 2153 in addition to the application of the vacuum 138 to remove the processing fluid and the IPA/$N_2$ 137 from the substrate surface 102a can generate the fluid meniscus 130. The fluid meniscus 130 may be a fluid layer defined between the proximity head 110 and the substrate surface that can be moved across a substrate surface 102 in a stable and controllable manner. In one embodiment, the fluid meniscus 130 may be defined by a constant application and removal of the processing fluid. The fluid layer defining the fluid meniscus 130 may be any suitable shape and/or size depending on the size, number, shape, and/or pattern of the source inlets 136, source outlets 134, and source inlets 132.

In addition, any suitable flow rates of the vacuum, IPA/$N_2$, vacuum, and the processing fluid may be used depending on the type of fluid meniscus desired to be generated. In yet another embodiment, depending on the distance between the proximity head 110 and the substrate surface, the IPA/$N_2$ may be omitted when generating and utilizing the fluid meniscus 130. In such an embodiment, the proximity head 110 may not include the source inlet 138 and therefore only the application of the processing fluid by the source inlet 136 and the removal of the processing fluid by the source outlet 134 generate the fluid meniscus 130.

In other embodiments of the proximity head 110, the processing surface of the proximity head 110 (the region of the proximity head where the source inlets and source outlets are located) may have any suitable topography depending on, the configuration of the fluid meniscus 130 to be generated. In one embodiment, the processing surface of the proximity head may be either indented or may protrude from the surrounding surface.

FIG. 5B shows a top view of a portion of a proximity head 110 in accordance with one embodiment of the present invention. It should be appreciated that the configuration of the proximity head 110 is exemplary in nature. Therefore, other configurations of proximity heads 110 may be utilized to generate the fluid meniscus 130 as long as the processing fluid can be applied to a substrate surface and removed from the substrate surface to generate a stable fluid meniscus 130 on the substrate surface. In addition, as discussed above, other embodiments of the proximity head 110 do not have to have the source inlet 1316 when the proximity head 110 is configured to generate the fluid meniscus without usage of $N_2$/IPA.

In the top view of one embodiment, from left to right are a set of the source inlet 132, a set of the source outlet 134, a set of the source inlet 136, a set of the source outlet 134, and a set of the source inlet 132. Therefore, as $N_2$/IPA and processing chemistry are inputted into the region between the proximity head 110 and the substrate surface, the vacuum removes the $N_2$/IPA and the processing chemistry along with any fluid film and/or contaminants that may reside on the substrate 102. The source inlets 132, the source inlets 136, and the source outlets 134 described herein may also be any suitable type of geometry such as for example, circular opening, triangle opening, square opening, etc. In one embodiment, the source inlets 132 and 136 and the source outlets 134 have circular openings. It should be appreciated that the proximity head 110 may be any suitable size, shape, and/or configuration depending on the size and shape of the fluid meniscus 130 desired to be generated. In one embodiment, the proximity head may extend less than a radius of the substrate. In another embodiment, the proximity head may extend more than the radius of the substrate. In another embodiment, the proximity head may extend greater than a diameter of the substrate. Therefore, the size of the fluid meniscus may be any suitable size depending on the size of a substrate surface area desired to be processed at any given time. In addition, it should be appreciated that the proximity head 110 may be positioned in any suitable orientation depending on the substrate processing operation such as, for example, horizontally, vertically, or any other suitable position in between. The proximity head 110 may also be incorporated into a substrate processing system where one or more types of substrate processing operations may be conducted.

Figure 5C:
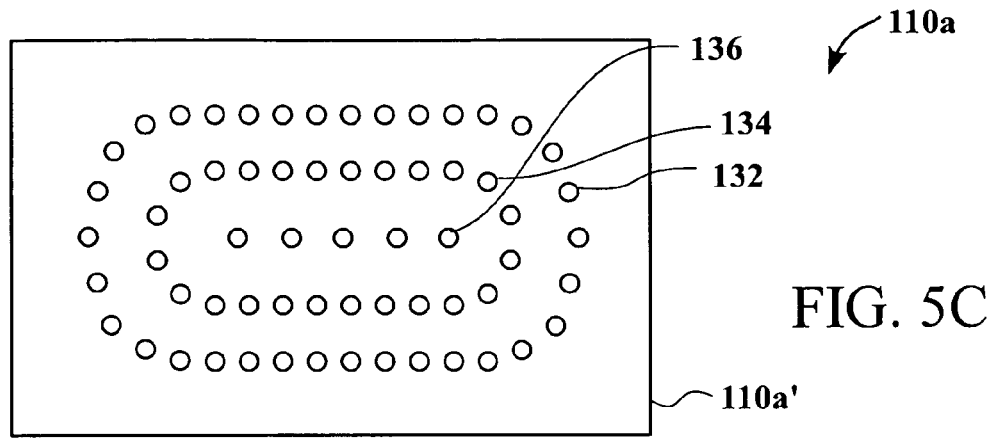
FIG. 5C illustrates another inlets/outlets pattern of a proximity head in accordance with still another embodiment of the present invention.

FIG. 5C illustrates an inlets/outlets pattern of a proximity head 110 in accordance with one embodiment of the present invention. In this embodiment, the proximity head 110 includes the source inlets 132 and 136 as well as source outlets 134. In one embodiment, the source outlets 134 may surround the source inlets 136 and the source inlets 132 may surround the source outlets 134.

Figure 5D:
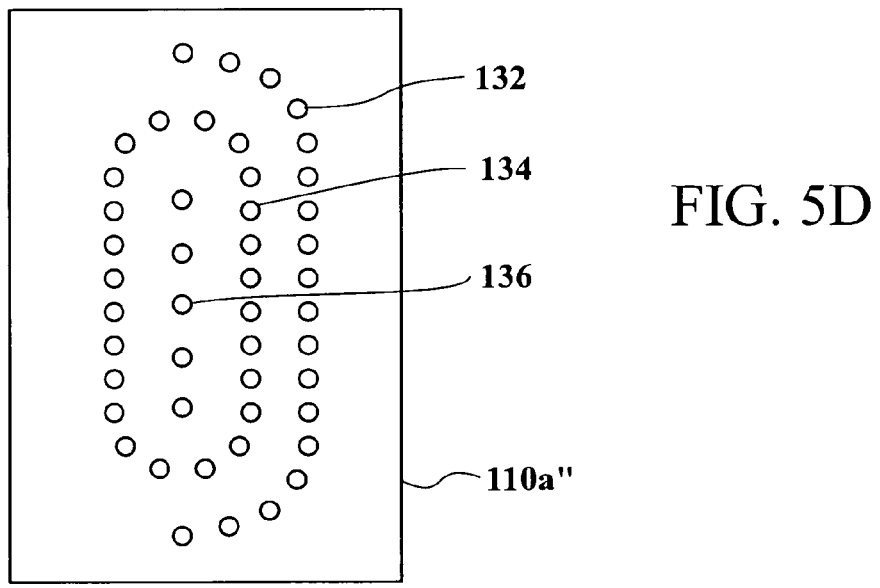
FIG. 5D illustrates a further inlets/outlets pattern of a proximity head in accordance with yet another embodiment of the present invention.

FIG. 5D illustrates another inlets/outlets pattern of a proximity head 110 in accordance with one embodiment of the present invention. In this embodiment, the proximity head 110 includes the source inlets 132 and 136 as well as source outlets 134. In one embodiment, the source outlets 134 may surround the source inlets 136 and the source inlets 132 may at least partially surround the source outlets 134.

Figure 5E:
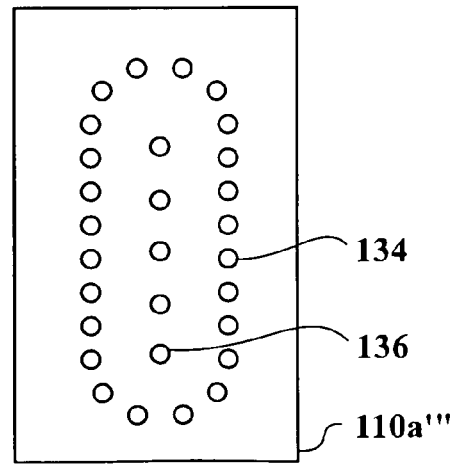
FIG. 5E illustrates a further inlets/outlets pattern of a proximity head in accordance with yet another embodiment of the present invention.

FIG. 5E illustrates a further inlets/outlets pattern of a proximity head 110 in accordance with one embodiment of the present invention. In this embodiment, the proximity head 110 includes the source inlets 132 and 136 as well as source outlets 134. In one embodiment, the source outlets 134 may surround the source inlets 136. In one embodiment, the proximity head 110 does not include source inlets 132 because, in one embodiment, the proximity head 110 is capable of generating a fluid meniscus without application of IPA/N$_2$. It should be appreciated that the above described inlets/outlets patterns are exemplary in nature and that any suitable type of inlets/outlets patterns may be used as long as a stable and controllable fluid meniscus can be generated. In one embodiment, depending on how close the proximity head is to the surface being processed, IPA may not be utilized and only processing fluid inlets and vacuum outlets can be used to generate the fluid meniscus. Such an embodiment is described in further detail in reference to U.S. application Ser. No. 10/882,835 entitled "Method And Apparatus For Processing Wafer Surfaces Using Thin, High Velocity Fluid Layer" which is hereby incorporated by reference in its entirety.

For additional information about the proximity vapor clean and dry system, reference can be made to an exemplary system described in the U.S. Pat. No. 6,488,040, issued on Dec. 3, 2002, having inventors John M. de Larios, Mike Ravkin, Glen Travis, Jim Keller, and Wilbur Krusell, and entitled "CAPILLARY PROXIMITY HEADS FOR SINGLE WAFER CLEANING AND DRYING." This U.S. Patent Application, which is assigned to Lam Research Corporation, the assignee of the subject application, is incorporated herein by reference.

For additional information with respect to the proximity head, reference can be made to an exemplary proximity head, as described in the U.S. Pat. No. 6,616,772, issued on Sep. 9, 2003, having inventors John M. de Larios, Mike Ravkin, Glen Travis, Jim Keller, and Wilbur Krusell, and entitled "METHODS FOR WAFER PROXIMITY CLEANING AND DRYING." This U.S. Patent Application, which is assigned to Lam Research Corporation, the assignee of the subject application, is incorporated herein by reference.

For additional information about top and bottom menisci, reference can be made to the exemplary meniscus, as disclosed in U.S. patent application Ser. No. 10/330,843, filed on Dec. 24, 2002, having inventor Carl Woods, and entitled "MENISCUS, VACUUM, IPA VAPOR, DRYING MANIFOLD." This U.S. Patent Application, which is assigned to Lam Research Corporation, the assignee of the subject application, is incorporated herein by reference.

For additional information about top and bottom menisci, vacuum, and WA vapor, reference can be made to the exemplary system, as disclosed in U.S. patent application Ser. No. 10/330,897, filed on Dec. 24, 2002, having inventor Carl Woods, and entitled "SYSTEM FOR SUBSTRATE PROCESSING WITH MENISCUS, VACUUM, IPA VAPOR, DRYING MANIFOLD." This U.S. Patent Application, which is assigned to Lam Research Corporation, the assignee of the subject application, is incorporated herein by reference.

For additional information about proximity processors, reference can be made to the exemplary processor, as disclosed in U.S. patent application Ser. No. 10/404,270, filed on Mar. 31, 2003, having inventors James P. Garcia, Mike Ravkin, Carl Woods, Fred C. Redeker, and John M. de Larios, and entitled "VERTICAL PROXIMITY PROCESSOR." This U.S. Patent Application, which is assigned to Lam Research Corporation, the assignee of the subject application, is incorporated herein by reference.

For additional information about front and bottom menisci, reference can be made to the exemplary dynamic meniscus, as disclosed in U.S. patent application Ser. No. 10/404,692, filed on Mar. 31, 2003, having inventors James P. Garcia, John M. de Larios, Michael Ravkin, and Fred C. Redeker, and entitled "METHODS AND SYSTEMS FOR PROCESSING A SUBSTRATE USING A DYNAMIC LIQUID MENISCUS." This U.S. Patent Application, which is assigned to Lam Research Corporation, the assignee of the subject application, is incorporated herein by reference.

For additional information about meniscus, reference can be made to the exemplary dynamic liquid meniscus, as disclosed in U.S. patent application Ser. No. 10/603,427, filed on Jun. 24, 2003, having inventors Carl A. Woods, James P. Garcia, and John M. de Larios, and entitled "METHODS AND SYSTEMS FOR PROCESSING A BEVEL EDGE SUBSTRATE USING A DYNAMIC LIQUID MENISCUS." This U.S. Patent Application, which is assigned to Lam Research Corporation, the assignee of the subject application, is incorporated herein by reference.

For additional information about proximate cleaning and/or drying, reference can be made to the exemplary wafer process, as disclosed in U.S. patent application Ser. No. 10/606,022, filed on Jun. 24, 2003, having inventors John M. Boyd, John M. de Larios, Michael Ravkin, and Fred C. Redeker, and entitled "SYSTEM AND METHOD FOR INTEGRATING IN-SITU METROLOGY WITHIN A WAFER PROCESS." This U.S. Patent Application, which is assigned to Lam Research Corporation, the assignee of the subject application, is incorporated herein by reference.

For additional information about depositing and planarizing thin films of semiconductor substrates, reference can be made to the exemplary apparatus and method, as disclosed in U.S. patent application Ser. No. 10/607,611, filed on Jun. 27, 2003, having inventors John Boyd, Yezdi N. Dordi, and John M. de Larios, and entitled "APPARATUS AND METHOD FOR DEPOSITING AND PLANARIZING THIN FILMS OF SEMICONDUCTOR WAFERS." This U.S. Patent Application, which is assigned to Lam Research Corporation, the assignee of the subject application, is incorporated herein by reference.

For additional information about cleaning a substrate using megasonic cleaning, reference can be made to the exemplary method and apparatus, as disclosed in U.S. patent application Ser. No. 10/611,140, filed on Jun. 30, 2003, having inventors John M. Boyd, Mike Ravkin, Fred C. Redeker, and John M. de Larios, and entitled "METHOD AND APPARATUS FOR CLEANING A SUBSTRATE USING MEGASONIC POWER." This U.S. Patent Application, which is assigned to Lam Research Corporation, the assignee of the subject application, is incorporated herein by reference.

For additional information about proximity brush cleaning, reference can be made to the exemplary proximity brush, as disclosed in U.S. patent application Ser. No. 10/742,303, filed on Dec. 18, 2003, having inventors John M. Boyd, Michael L. Orbock, and Fred C. Redeker, and entitled "PROXIMITY BRUSH UNIT APPARATUS AND METHOD." This U.S. Patent Application, which is assigned to Lam Research Corporation, the assignee of the subject application, is incorporated herein by reference.

Various proximity heads and methods of using the proximity heads are described in co-owned U.S. patent application Ser. No. 10/834,548 filed on Apr. 28, 2004 and entitled "APPARATUS AND METHOD FOR PROVIDING A CONFINED LIQUID FOR IMMERSION LITHOGRAPHY," which is a continuation in part of U.S. patent application Ser. No. 10/606,022, filed on Jun. 24, 2003 and entitled "SYSTEM AND METHOD FOR INTEGRATING IN-SITU METROLOGY WITHIN A WAFER PROCESS." Additional embodiments and uses of the proximity head are also disclosed in U.S. patent application Ser. No. 10/404,692, filed on Mar. 31, 2003, entitled "METHODS AND SYSTEMS FOR PROCESSING A SUBSTRATE USING A DYNAMIC LIQUID MENISCUS." Additional information with respect to proximity cleaning can be found in U.S. patent application Ser. No. 10/817,355 filed on Apr. 1, 2004 entitled "SUBSTRATE PROXIMITY PROCESSING STRUCTURES AND METHODS FOR USING AND MAKING THE SAME," U.S. patent application Ser. No. 10/817,620 filed on Apr. 1, 2004 entitled "SUB- STRATE MENISCUS INTERFACE AND METHODS FOR OPERATION," and U.S. patent application Ser. No. 10/817,133 filed on Apr. 1, 2004 entitled "PROXIMITY MENISCUS MANIFOLD." The aforementioned patent applications are hereby incorporated by reference in their entirety.

Additional embodiments and uses of the proximity head are also disclosed in U.S. patent application Ser. No. 10/330, 897, filed on Dec. 24, 2002, entitled "System for Substrate Processing with Meniscus, Vacuum, IPA vapor, Drying Manifold" and U.S. patent application Ser. No. 10/404,270, filed on Mar. 31, 2003, entitled "Vertical Proximity Processor," U.S. patent application Ser. No. 10/817,398 filed on Apr. 1, 2004 entitled "Controls of Ambient Environment During Wafer Drying Using Proximity Head," U.S. Pat. No. 6,488, 040, issued on Dec. 3, 2002, entitled "Capillary Proximity Heads For Single Wafer Cleaning And Drying," and U.S. Pat. No. 6,616,772, issued on Sep. 9, 2003, entitled "Methods For Wafer Proximity Cleaning And Drying." Still further, additional embodiments and uses of the proximity head are described in U.S. patent application Ser. No. 10/883,301 entitled "Concentric Proximity Processing Head," and U.S. patent application Ser. No. 10/882,835 entitled "Method and Apparatus for Processing Wafer Surfaces Using Thin, High Velocity Fluid Layer." Further embodiments and uses of the proximity head are further described in U.S. patent application Ser. No. 10/957,260 entitled "Apparatus And Method For Processing A Substrate," U.S. patent application Ser. No. 10/956,799 entitled "Apparatus And Method For Utilizing A Meniscus In Substrate Processing" and U.S. patent application Ser. No. 10/957,384 entitled "Phobic Barrier Meniscus Separation And Containment." The aforementioned patent applications are hereby incorporated by reference in their entirety.

Although the foregoing invention has been described in some detail for purposes of clarity of understanding, it will be apparent that certain changes and modifications may be practiced within the scope of the appended claims. For example, the embodiments of the present invention can be implemented to clean any substrate having varying sizes and shapes such as those employed in the manufacture of semiconductor devices, flat panel displays, hard drive discs, flat panel displays, and the like. Additionally, the present embodiments are to be considered as illustrative and not restrictive, and the invention is not to be limited to the details given herein, but may be modified within the scope and equivalents of the appended claims.

What is claimed is:

1. A substrate support for holding a substrate during fluid preparation, comprising:
    a carrier having a front side, a back side, and an opening defining an inner rim;
    a support member connected to the inner rim, the support member including a resistive material, the resistive material being coupled to a first electrode and a second electrode, the resistive material enabling a current between the first electrode and the second electrode so as to enable current heating of the resistive material of the support member, the support member being configured to support the substrate from an outer edge of the substrate at a point and expose both a first and second surface side of the substrate from the front side and back side of the carrier when disposed in the opening of the carrier;
    wherein the carrier includes two or more of the support members to enable holding of the substrate.

2. A substrate support for holding a substrate during fluid preparation as recited in claim 1, wherein the opening is a circular opening.

3. A substrate support for holding a substrate during fluid preparation as recited in claim 1, wherein the fluid preparation is assisted by one or more proximity heads, each one of the one or more proximity heads being capable of generating a fluid meniscus on either the first or second surface side of the substrate.

4. A substrate support for holding a substrate during fluid preparation as recited in claim 3, wherein some fluid introduced by the fluid meniscus at or near the point where the substrate is supported is exposed to the current heating.

5. A substrate preparation system, the system comprising:
    a carrier configured to hold a substrate to be prepared, the carrier having an opening defining an inner rim, the substrate having a front surface and a back surface;
    a proximity head defined proximate to the front surface of the substrate, the proximity head configured to prepare the front surface of the substrate;
    a substrate support member secured to the carrier, the substrate support member having a first end and a second end, the first end of the substrate support member being in contact with the back surface of the substrate at a point of contact and a second end of the substrate support member being secured to the carrier; and
    a pair of electrical contacts,
    wherein the substrate support member includes a resistive material, the resistive material being coupled to the pair of electrical contacts, the resistive material enabling a current between the pair of electrical contacts, so as to enable resistive heating of the resistive material,
    wherein the substrate support member is configured to be resistively heated after the substrate support member has passed by the proximity heads so as to evaporate a residual fluid defined at the point of contact between the first end of the substrate support member and the back surface of the substrate.

6. The system as recited in claim 5, wherein the substrate support member is resistively heated after the substrate support member has passed by a fluid meniscus generated by the proximity head.

7. The system as recited in claim 6, wherein the substrate support member is a pin having a hollow tube shape.

8. The system as recited in claim 7, wherein a first electrical contact is defined close to the first end of the pin and a second electrical contact is defined close to the second end of the pin, or the first electrical contact is defined close to the first end of the pin and the second electrical contact is defined on a body of the carrier.

9. The system as recited in claim 8, wherein an insulator component is defined between the substrate support member and the carrier.

10. The system as recited in claim 5, wherein the substrate support member is a solid core pin.

11. The system as recited in claim 10, wherein a first electrical contact is defined close to the first end of the solid core pin and a second electrical contact is defined close to the second end of the solid core pin, or the first electrical contact is defined close to the first end of the solid core pin and the second electrical contact is defined on a body of the carrier.

12. The system as recited in claim 5, further including a second proximity head defined proximate to the back surface of the substrate, the second proximity head configured to prepare the back surface of the substrate.

13. A substrate preparation system, the system comprising:
a carrier configured to hold a substrate to be prepared, the carrier having an opening defining an inner rim;
a leading proximity head, a middle proximity head, and a trailing proximity head configured to prepare a back surface of the substrate as the carrier passes by the leading, middle, and trailing proximity heads, successively;
a leading support member, a second support member, and a trailing support member being secured to the carrier, the leading, second, and trailing support members having a corresponding first end and a corresponding second end, the first ends of the leading, second, and trailing support members being in contact with a back surface of the substrate at respective points of contact and the second ends of the leading, second, and trailing support members being secured to the carrier, wherein the leading, second, and trailing support members are configured to successively pass by the leading, middle, and trailing proximity heads; and
a leading pair of electrical contacts, a second pair of electrical contacts, and a trailing pair of electrical contacts,
wherein the leading, second, and trailing support members include a leading resistive material, a second resistive material, and a trailing resistive material, respectively, the leading, second, and trailing resistive materials being coupled to the leading, second, and trailing pair of electrical contacts, respectively, the leading, second, and trailing resistive materials enabling a leading current, a second current, and a trailing current, respectively, between the leading, second, and trailing pairs of electrical contacts, respectively, so as to enable resistive heating of the leading, second and trailing resistive materials, respectively,
wherein as the second ends corresponding to the leading, second, and trailing support members exit the trailing proximity head, successively, the leading, second, and trailing support members are configured to be resistively heated consecutively until residual fluids defined at the corresponding points of contact between the first ends of the leading, second, and trailing support members and the substrate back surface are evaporated.

14. The system as recited in claim 13, wherein a first period associated with resistively heating the leading support member is configured to be greater than a second period associated with heating the second support member, and further wherein the second period associated with resistively heating the second support member is greater than a third period associated with resistively heating the trailing support member, or a first voltage implemented to resistively heat the leading support member is configured to be less than a second voltage implemented to resistively heat the second support member, and further wherein the second voltage implemented to resistively heat the second support member is configured to be less than a third voltage applied to resistively heat the trailing support member.

15. A substrate support for holding a substrate during fluid preparation, comprising:
a carrier configured to hold a substrate to be prepared, the carrier having a front side, a back side, and an opening defining an inner rim;
three support pins connected to the inner rim, each of the support pins including a resistive material, the resistive material being coupled to a first electrode and a second electrode, the resistive material enabling a current between the first electrode and the second electrode so as to enable current heating of the resistive material of the support pin, each support pin being configured to support the substrate from an outer edge of the substrate at a point and expose both a first and second surface side of the substrate from the front side and back side of the carrier when disposed in the opening of the carrier.

16. The system as recited in claim 15, wherein each of the support pins is resistively heated after the support pin has passed by a fluid meniscus generated by a proximity head.

17. The system as recited in claim 15, wherein each of the support pins is a pin having a hollow tube shape.

18. The system as recited in claim 15, wherein an insulator component is defined between each of the support pins and the carrier.

19. The system as recited in claim 15, wherein each of the support pins is a solid core pin.

* * * * *